(12) United States Patent
Rubel

(10) Patent No.: US 7,724,121 B2
(45) Date of Patent: May 25, 2010

(54) SINGLY ATTACHED MEMS THERMAL DEVICE AND METHOD OF MANUFACTURE

(75) Inventor: Paul J. Rubel, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 881 days.

(21) Appl. No.: 11/516,489

(22) Filed: Sep. 7, 2006

(65) Prior Publication Data

US 2008/0061913 A1 Mar. 13, 2008

(51) Int. Cl.
*H01H 71/18* (2006.01)
*H01H 61/00* (2006.01)
*F16K 31/02* (2006.01)
*H02N 10/00* (2006.01)

(52) U.S. Cl. .................. 337/139; 337/123; 310/306; 251/129.01

(58) Field of Classification Search ................ 337/139, 337/123; 310/306; 251/129.01
See application file for complete search history.

(56) References Cited

U.S. PATENT DOCUMENTS

| | | | | |
|---|---|---|---|---|
| 4,423,401 A | * | 12/1983 | Mueller | 337/107 |
| 5,027,101 A | * | 6/1991 | Morrill, Jr. | 337/297 |
| 6,407,478 B1 | * | 6/2002 | Wood et al. | 310/307 |
| 6,531,947 B1 | * | 3/2003 | Weaver et al. | 337/139 |
| 6,679,055 B1 | * | 1/2004 | Ellis | 60/527 |
| 6,691,513 B1 | * | 2/2004 | Kolesar | 60/527 |
| 6,703,916 B2 | * | 3/2004 | Charvet et al. | 337/141 |
| 6,739,132 B2 | * | 5/2004 | Bromley et al. | 60/527 |
| 7,036,312 B2 | | 5/2006 | Menard et al. | |
| 7,339,454 B1 | * | 3/2008 | Fleming | 337/141 |
| 7,471,184 B1 | * | 12/2008 | Aksyuk et al. | 337/1 |
| 2006/0238279 A1 | * | 10/2006 | Lu et al. | 335/78 |
| 2007/0096860 A1 | * | 5/2007 | Foster et al. | 337/36 |

* cited by examiner

*Primary Examiner*—Jayprakash N Gandhi
*Assistant Examiner*—Bradley H Thomas
(74) *Attorney, Agent, or Firm*—Jacquelin K. Spong

(57) ABSTRACT

An improved MEMS thermal actuator has a cantilevered beam and a conductive circuit having two driving arms, an inner arm adjacent to the cantilevered beam, and an outer arm adjacent to the inner arm. Current flows through the inner and outer arms to heat the conductive circuit, causing it to expand relative to the cantilevered beam. A tether ties the conductive circuit to the cantilevered beam, so that upon expansion, the conductive circuit causes the cantilevered beam to deflect about its anchor point. However, only the inner arm of the driving beam is coupled to the cantilevered beam. Since the outer arm of the conductive circuit is not coupled to the cantilevered beam, the overall stiffness of the actuator may be decreased. In addition, serpentines may be placed in the outer arm of the conductive circuit, in order to further decrease the stiffness of this beam. The actuator may therefore be made more efficient, in that the deflection of the cantilevered beam may be increased for a given input current.

20 Claims, 9 Drawing Sheets

SINGLY ATTACHED MEMS THERMAL DEVICE AND METHOD OF MANUFACTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a microelectromechanical systems (MEMS) thermal device, and its method of manufacture. More particularly this invention relates to a MEMS thermal switch for switching electrical signals.

Microelectromechanical systems (MEMS) are very small moveable structures made on a substrate using lithographic processing techniques, such as those used to manufacture semiconductor devices. MEMS devices may be moveable actuators, valves, pistons, or switches, for example, with characteristic dimensions of a few microns to hundreds of microns. A moveable MEMS switch, for example, may be used to connect one or more input terminals to one or more output terminals, all microfabricated on a substrate. The actuation means for the moveable switch may be thermal, piezoelectric, electrostatic, or magnetic, for example.

FIG. 1 shows an example of a prior art thermal switch, such as that described in U.S. Pat. No. 7,036,312, to Menard, et al. The thermal switch 10 includes two cantilevers, 100 and 200. Each cantilever 100 and 200 contains a passive cantilevered beam 110 and 210, respectively. A conductive circuit 120 and 220, is coupled to each cantilevered beam 110 and 210 by a plurality of dielectric tethers 150 and 250, respectively. When a voltage is applied between terminals 130 and 140, a current is driven through conductive circuit 120. The Joule heating generated by the current causes the circuit 120 to expand relative to the unheated cantilevered beam 110. Since the circuit is coupled to the cantilevered beam 110 by the dielectric tether 150, the expanding conductive circuit drives the cantilevered beam in the upward direction 165.

Applying a voltage between terminals 230 and 240 causes heat to be generated in circuit 220, which then drives cantilevered beam 210 in the direction 265 shown in FIG. 1. Therefore, one beam 100 moves in direction 165 and the other beam 200 moves in direction 265. These movements may be used to open and close a set of contacts located on contact flanges 170 and 270, each in turn located on tip members 160 and 260, respectively. For example, driving cantilever 100 in direction 165, then driving cantilever 200 in direction 265, relaxing cantilever 100 and then relaxing cantilever 200 may serve to close the switch, by engaging contact flanges 170 and 270. In this position, contact between the faces of contact flanges 170 and 270 provides an electrical connection between cantilevers 100 and 200, such that in FIG. 2d, the electrical switch is closed. Opening the electrical switch is accomplished by reversing the movements in the steps described above.

SUMMARY

In the prior art switch of FIG. 1, each dielectric tether 150 and 250 is attached to both arms of the conductive circuits 120 and 220. Because of these attachments, substantial stress must be overcome in order to move cantilevers 100 and 200 in the desired directions 165 and 265. In particular, tip member 260 and contact flange 270 may be required to move 15-20 μm to clear the width of contact flange 170 and to allow some budget for tolerances and initial offset. Using the design illustrated in FIG. 1, a substantial amount of current may be required to achieve this deflection.

Systems and methods are described here for manufacturing a more efficient actuator, wherein the deflection of the actuator for a given amount of input current is large compared to that of the design illustrated in FIG. 1.

In the systems and methods described here, an actuator is described which uses a passive cantilevered beam coupled to a thermally conductive drive circuit. A dielectric tether attaches the cantilevered beam only to the inner arm of the conductive circuit. Since the outer arm of the conductive circuit is not tethered to the cantilevered beam, it is allowed to bend relatively freely, and serves primarily to return the current to a low voltage return pad. This allows the actuator to have less stiffness, so that the cantilever bends more easily, with less stress, and therefore makes a more efficient actuator.

In the systems and methods described here, a second dielectric tether tethers the distal end of the inner arm of the conductive circuit at a point where essentially no current is flowing in the conductive circuit. To form this no current point, an extension is formed on the distal end of the inner arm of the conductive circuit, and the outer arm of the conductive circuit is electrically coupled to the inner arm at a point inboard of this extension. Since no current is flowing through the extension, the temperature of the extension may be relatively low compared to the temperature within the inner or outer arms. By coupling the cantilevered beam to the inner arm at the point of the extension, the amount of heat transferred to the cantilevered beam is reduced, thus also increasing the efficiency of the actuator by keeping the cantilevered beam relatively cool.

Since the outer arm of the conductive circuit is not coupled to the cantilevered beam, it may be made as flexible as possible, so as not to contribute to the stiffness of the actuator. To reduce the stiffness of the outer arm, one or more serpentine features may be formed in the outer arm. The outer arm may be coupled to the inner arm with dielectric tethers attached at a point within the serpentine feature, to resist buckling or column failure of the outer arm, which might otherwise lead to shorting of the outer arm with the inner arm.

The cantilevered beam and conductive circuits may be made of nickel or a nickel alloy, for example. The nickel may be electroplated onto a seed layer through a photoresist stencil patterned on a substrate. The dielectric tethers may be conveniently made of a photoresist, which is hard baked after patterning to stabilize the material for permanent use in the actuator structure.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

DETAILED DESCRIPTION

A thermal actuator is described which is suitable for use in an electrical switch, such as a switch for telephone signals. However, it should be understood that this embodiment is exemplary only, and that this type of thermal actuator may be applied to any of a number of devices, including valves, optical devices and sensors, for example.

Figure 1:
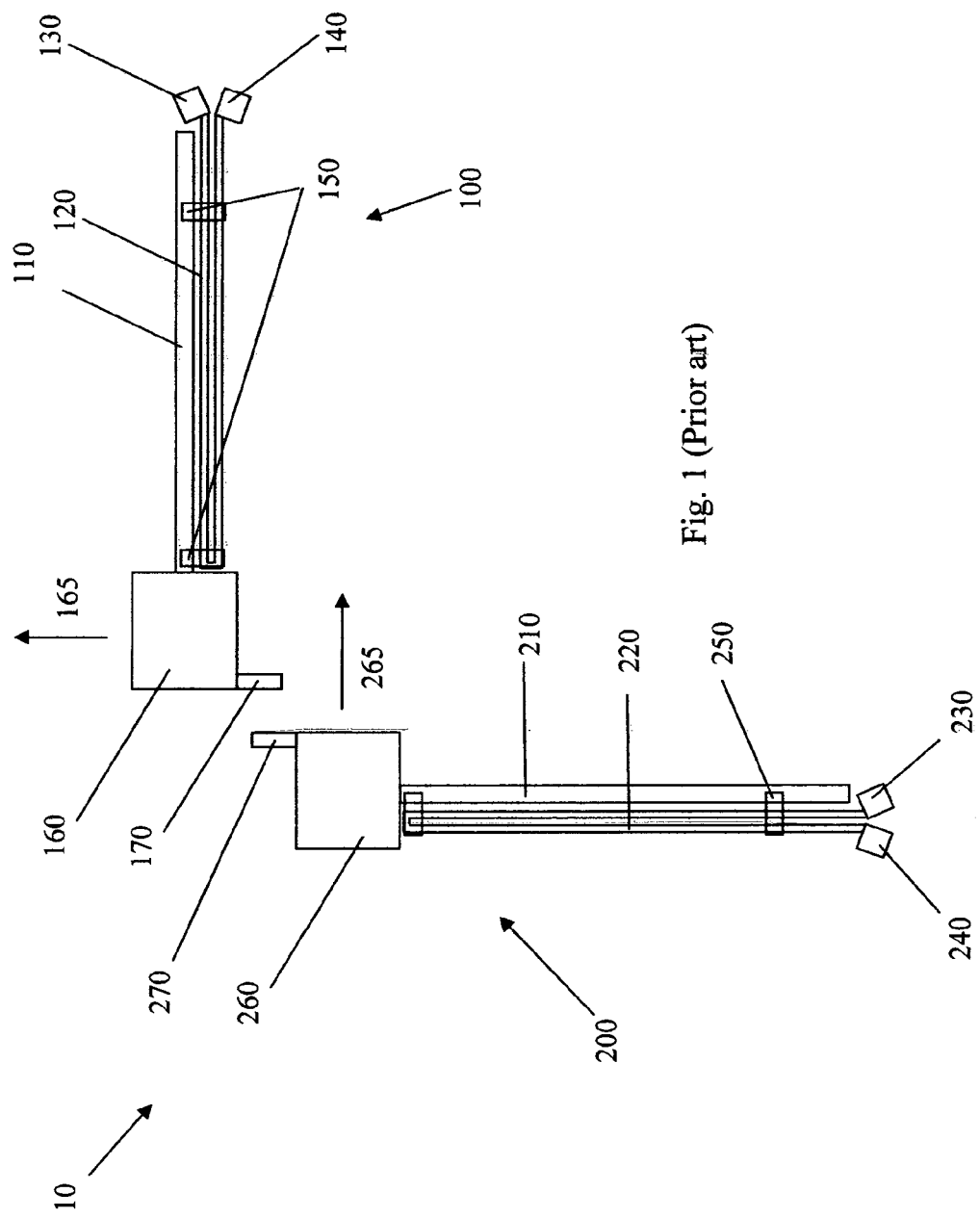
FIG. 1 is a schematic diagram of a prior art thermal switch.
Figure 2:
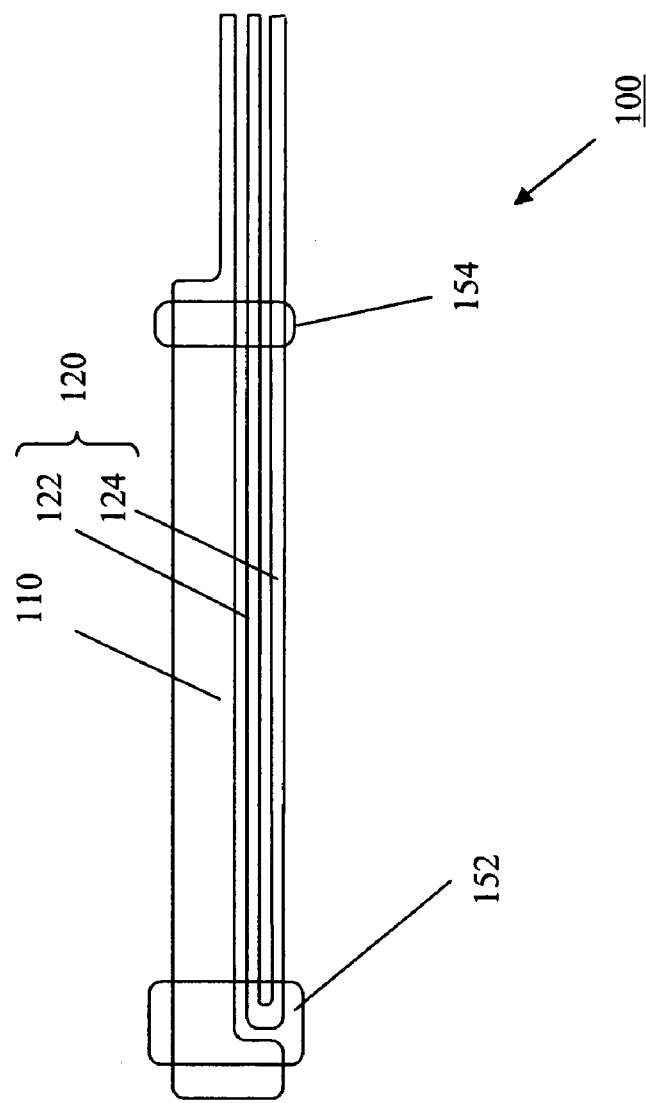
FIG. 2 is a simplified diagram of one of the thermal actuators of the switch illustrated in FIG. 1.

FIG. 2 shows additional detail of a thermal actuator 100, such as that used in the switch of FIG. 1. The thermal actuator 100 may include a conductive circuit 120 having an inner arm 122 and an outer arm 124. The thermal actuator may further include a cantilevered beam anchored at its proximal point to the substrate, and suspended freely at its distal end. The terms "beam" and "arm" are used interchangeably herein, to refer to a member whose length is substantially longer than its thickness or width. Both the inner arm 122 and outer arm 124 of conductive circuit 120 are attached to the cantilevered beam 110 by at least two dielectric tethers 152 and 154. Dielectric tether 152 may attach the distal ends of the inner arm 122 and outer arm 124 to the cantilevered beam 110. Dielectric tether 154 may attach a proximal end of inner arm 122 and outer arm 124 to a proximal point on the cantilevered beam 110.

Because all three beams, inner arm 122, outer arm 124 and cantilevered beam 110 are coupled together at two points, thermal actuator 100 may flex in such a way to accommodate the tethered endpoints of its three constituent beams. Because the ends of the three beams are tethered together by tethers 152 and 154, the thermal actuator is forced to adopt an "S" shape as will be discussed in greater detail with respect to FIGS. 4a-4c. The curvature of this shape causes substantial stress to the materials of the beam. As a result, much of the force delivered by the moving conductive circuit arms 122 and 124 is taken up by overcoming the stiffness of this deflection, rather than moving the cantilevered beam 110 in the desired direction 165. The degrades the efficiency of the device, as the actuator moves a smaller distance in desired direction 165 in response to a given input current. The stresses within the conductive circuit arms are large due to the S-shaped deflection. The maximum distance the actuator can move is limited by these large stresses creating plastic deformation in the conductive circuit arms.

Figure 3:
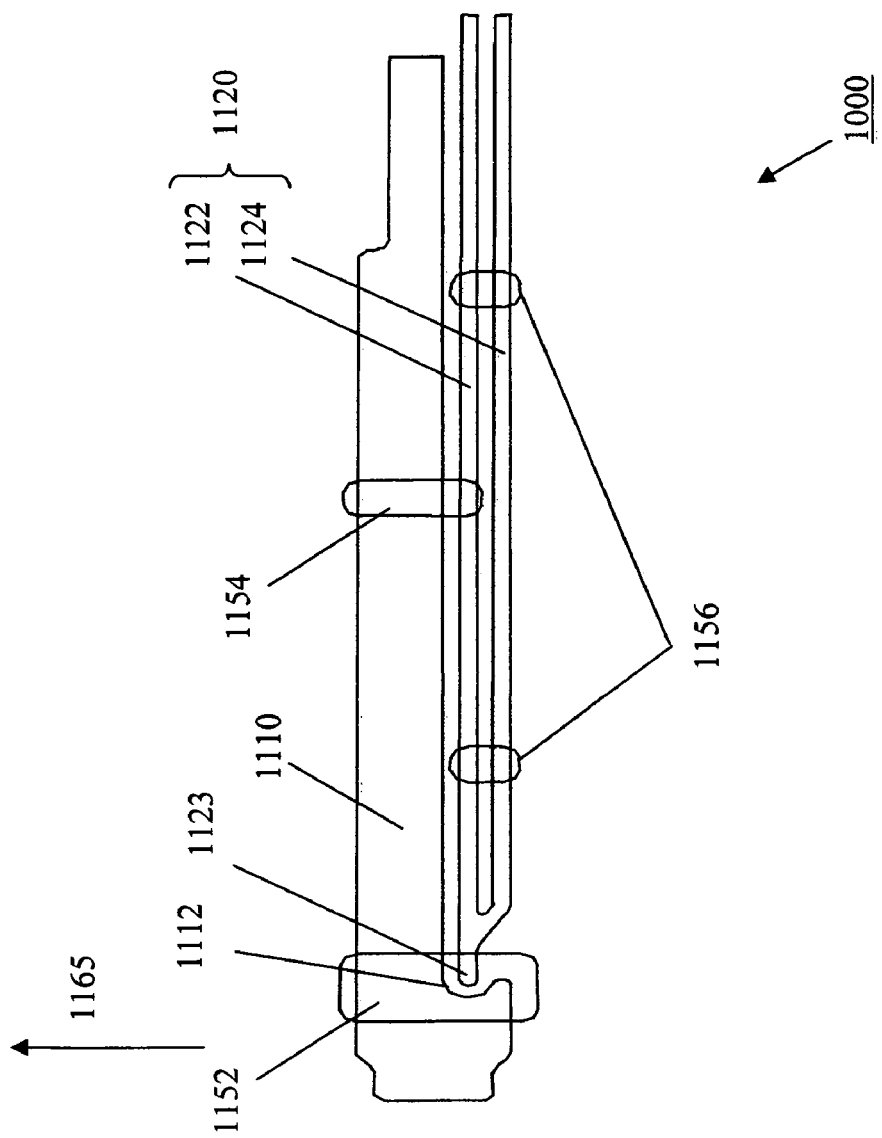
FIG. 3 is an illustration of a first exemplary embodiment of a singly attached thermal actuator.

FIG. 3 illustrates a first exemplary embodiment of a singly attached thermal actuator 1000. The term "singly attached" should be understood to mean that the cantilevered beam is only attached to one arm of the conductive driving circuit, rather than to both as in MEMS thermal actuator 100. The singly attached thermal actuator 1000 may be used in place of thermal actuator 100 in switch 10. Alternatively, singly attached thermal actuator 1000 may be used to open or close a valve, as well as to open and close an electrical switch, for example.

Like thermal actuator 100, singly attached thermal actuator 1000 includes a cantilevered beam 1110 and a conductive circuit having an inner arm 1122 and an outer arm 1124. Although not shown in FIG. 3, singly attached thermal actuator 1000 may also include contact flanges and tip members, analogous to 160 and 170 of FIG. 1.

In singly attached thermal actuator 1000, inner arm 1122 may have an extension 1123 at its distal end to which extends beyond the length of the outer arm 1124 and to which the outer arm 1124 may be joined at a point inboard of this extension 1123. Therefore, essentially no current flows through extension 1123, as the current flows to the outer arm 1124 at its connection point to the inner arm 1122. Extension 1123 may fit into a substantially circular cavity 1112 in cantilevered beam 1110. The extension 1123 is then attached to the cantilevered beam 1110 by a dielectric tether 1152. Dielectric tether 1152 does not attach the hot outer arm 1124 to the cantilevered beam 1110.

This design affords singly attached thermal actuator 1000 a number of advantages relative to thermal actuator 100. First, because substantially no current flows through it, extension 1123 remains relatively cool compared to inner arm 1122 and outer arm 1124 of conductive circuit 1120. Because of its relatively low temperature, less heat is transferred to cantilevered beam 1110 by dielectric tether 1152. This improves the efficiency of the device, because the cantilevered beam remains relatively cool, and therefore primarily bends in response to the heating of the hot inner arm 1122 of the conductive circuit 1120, rather than expanding from its own heating.

In addition, the extension 1123 fits into a substantially circular cavity, which helps anchor extension 1123 to the cantilevered beam 1110, and reduces the likelihood of the extension 1123 shearing away from cantilevered beam 1110. Use of the substantially circular cavity reduces the amount of dielectric required to attach the extension to the cantilevered beam 1110. By reducing the dielectric volume, the thermal resistance between the conductive circuit 1120 and cantilevered beam is increased, temperature differential between the two beams is increased, and thus the beam will move farther for a given current input or drive beam temperature.

Finally, the force delivered by hot inner arm 1122 of conductive circuit 1120 to the cantilevered beam 1110 is closer to the neutral axis of the cantilevered beam 1110. This enhances the response of the cantilevered beam 1110 to the force applied by hot inner arm 1122.

A second dielectric tether 1154 tethers a proximal portion of inner arm 1122 of conductive circuit 1120 to cantilevered beam 1110. Dielectric tether 1154 tethers only the inner arm 1122 of conductive circuit 1120 to the cantilevered beam 1110, whereas the outer arm 1124 is not tethered directly to the cantilevered beam 1110. For this reason, the outer arm 1124 is free to expand relative to the cantilevered beam 1110, and the driving force for the cantilevered beam 1110 is delivered by the inner arm 1122 via the dielectric tethers 1152 and 1154. Because the hot, inner arm 1122 tends to expand as it heats, but it is tied to cantilevered beam 1110, it tends to drive cantilevered beam 1110 in direction 1165. Because the outer arm 1124 is not highly stressed, a larger proportion of the force delivered by hot inner arm 1122 may be translated into motion of the cantilevered beam 1110, rather than taken up by distorting the hot inner arm 1122 and hot outer arm 1124 as was the case with thermal actuator 1000 shown in FIG. 2.

Two additional dielectric tethers 1156 may connect the inner hot arm 1122 to the outer hot arm 1124. The two additional dielectric tethers may preferably be placed approximately as shown in FIG. 3, within between about one quarter and one third of the distance to each end of the hot inner arm 1122 and the hot outer arm 1124. Being so placed, dielectric tethers 1156 resist the tendency of hot outer arm 1124 to buckle away from the hot inner arm 1122 and from cantilevered beam 1110 or suffer column failure at these locations.

Figure 4:
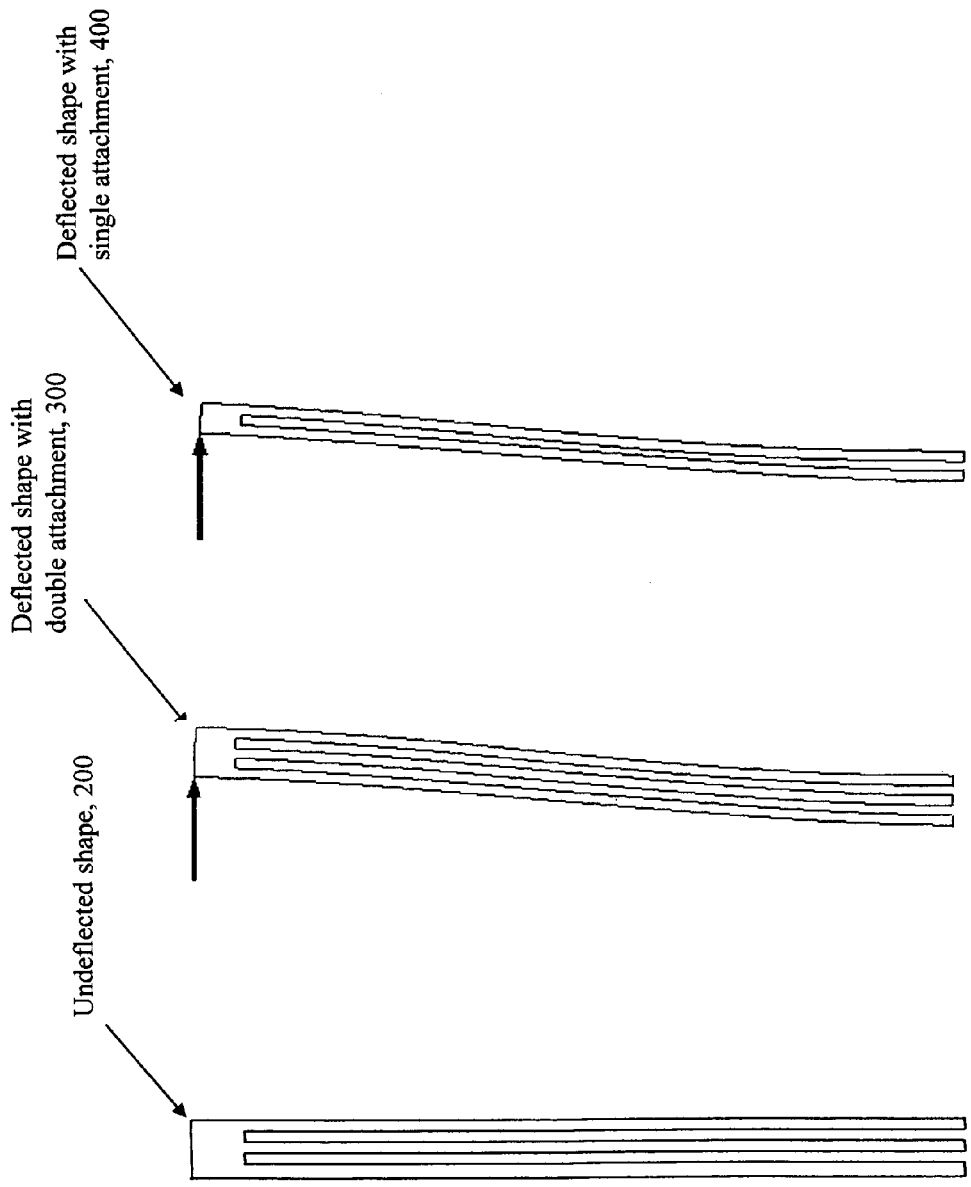
FIG. 4a is a diagram of the undeflected state of the actuator shown in FIG. 2.
FIG. 4b is an illustration of the deflected state of the actuator shown in FIG. 2.
FIG. 4c is an illustration of the deflected state of a singly attached actuator.

FIG. 4*a*-4*c* illustrate the difference in the kinematic behavior of thermal actuator 100 compared to singly attached thermal actuator 1000. FIG. 4*a* shows the undeflected position of thermal actuator 100. FIG. 4*b* illustrates thermal actuator 100 in a deflected state. Because the three beams are tethered at two points, the expansion of the hot inner arm and hot outer arm may cause the beams to take up an "S" shape, such that the endpoints are still aligned in the same line. In contrast, FIG. 4*c* illustrates the curvature of the singly attached thermal actuator 1000 in a deflected position. Because only the two beams, the hot inner arm 1122 and the cantilevered beam 1110 are tethered, the singly attached thermal actuator 1000 may bend in a less pronounced, less curved S-shape than the doubly attached actuator. Because of the less predominant S-shape, the deflection in FIG. 4*c* has less stress than the shape of FIG. 4*b*. Therefore, the actuator shown in FIG. 4*c* may have increased deflection without plastically deforming due to high stress levels. In addition, a greater proportion of the force may go to deflecting the actuator in the desired direction, rather than into distorting the cantilevered beams. This may improve the efficiency of the singly attached thermal actuator 1000, that is, the amount by which the singly attached thermal actuator 1000 moves in response to a given input current, compared to thermal actuator 100.

Figure 5:
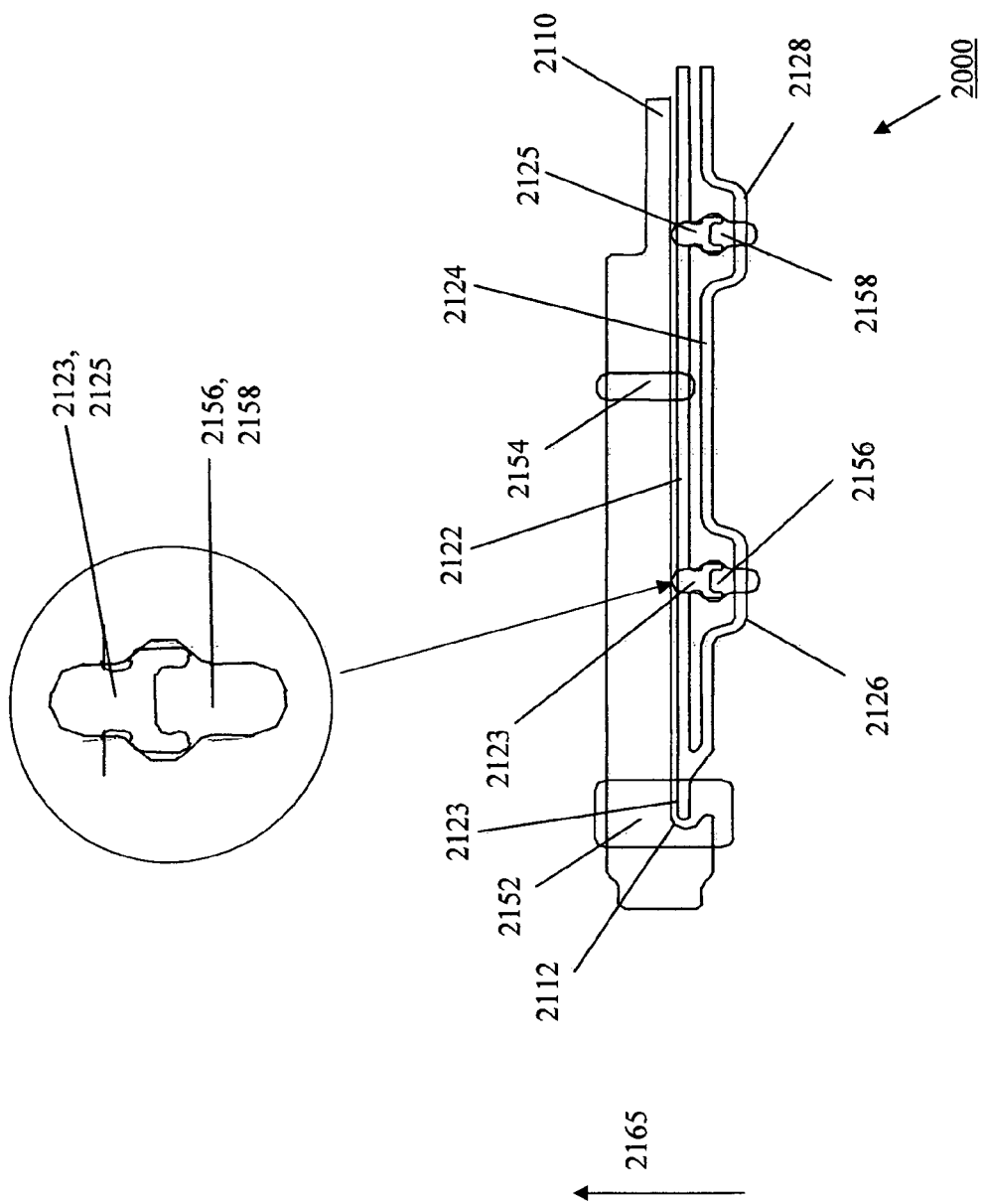
FIG. 5 is a second exemplary embodiment of a singly attached thermal actuator.

FIG. 5 shows a second exemplary embodiment of the singly attached thermal actuator 2000. Like singly attached thermal actuator 1000, singly attached thermal actuator 2000 may have an extension 2123 added to the distal end of the hot, inner arm 2122, which extends beyond the length of the hot, outer arm 2124. This extension 2123 may fit into a substantially circular cavity 2112 of the cantilevered beam 2110. The hot, outer arm 2124 may be electrically coupled to the hot, inner arm at a point inboard of this extension 2123. A single dielectric tether 2152 tethers the extension 2123 to the cantilevered beam 2110. Also like singly attached thermal actuator 1000, singly attached thermal actuator 2000 has a second dielectric tether 2154 that tethers the hot inner arm 2122 to the cantilevered beam 2110 at a point nearer its proximal end.

In singly attached thermal actuator 2000, since the outer hot arm 2124 is not attached to the cantilevered beam 2110, two serpentine shapes, 2126 and 2128 may be added to the outer hot arm 2124. A serpentine shape may be two substantially right-angled turns placed in the otherwise substantially linear extent of the cantilevered beam. The serpentine shapes may reduce the stiffness of the hot outer arm 2124, so that less stress is created by its deflection. This allows the hot, outer arm 2124 to serve primarily to return the current from the hot, inner arm 2122, without adding stiffness to the device. By reducing the stiffness of the hot, outer arm 2124, there is less need for some of the force created by the inner arm 2122 to be wasted on deflecting the outer, hot arm 2124, rather than deflecting the cantilevered beam 2110 in the desired direction 2165. This improves the efficiency of the device, that is, the amount by which the singly attached thermal actuator 2000 moves in response to a given input current.

At least one, and preferably two additional dielectric tethers 2156 and 2158 may serve to attach the hot, outer arm 2124 to the hot, inner arm 2122. These additional dielectric tethers 2156 and 2158 may preferably be located within the serpentine portions 2126 and 2128, respectively, of the hot, outer arm 2124. The dielectric tethers 2156 and 2158 may thereby serve to transmit additional longitudinal force to the hot, inner arm 2122, while allowing the hot, outer arm 2124 to flex longitudinally within the serpentine area. The dielectric tethers may also help the hot, outer arm 2124 to resist buckling and column failure in the regions adjacent to dielectric tethers 2156 and 2158. Otherwise, the serpentine shape of the outer hot arm 2124 may be more susceptible to buckling than the simple straight linear shape of outer arm 1124 of singly attached thermal actuator 1000 shown in FIG. 3.

The placement of the serpentine portions 2126 and 2128 with respect to the dielectric tether positions in the preferred arrangement shown in FIG. 5 maximizes the length of straight outer hot beam section that extends between the serpentines. This configuration creates a structure with low stiffness. A similar but less efficient design would be to position the serpentine in between the two dielectric tether points with short outer hot beams of similar lengths on either side connecting the serpentine to the tether points. In this case, the serpentine itself would provide similar flexibility as in the preferred design, but the short beam sections between the serpentine and the tether points would create a much stiffer structure than a serpentine with one long beam section. This increase in stiffness would increase the stress levels in this beam for the same magnitude of deflection.

The inset in FIG. 5 shows additional detail of the dielectric tethers 2156 and 2158. The tether connection may be made up of a portion of dielectric material 2156 and 2158, and a portion of the conductive material 2123 and 2125 of hot, inner arm 2122. In particular, the conductive material 2123 and 2125 may be formed monolithically and integrally with the hot, inner arm 2122 by, for example, the methods described below. The conductive material may be shaped so as to form the interlocking feature shown in the inset, which may mate with the shape of the dielectric material 2156 and 2158. Such shapes may enhance the ability of the outer, hot arm 2124 to transmit longitudinal force to the inner, hot arm 2122, while reducing the chances of the dielectric tether failing or breaking.

Singly attached thermal actuator 2000 may be used in conjunction with singly attached thermal actuator 1000, to form the two cantilevers of an electrical switch. The two cantilevers are generally disposed in a substantially orthogonal relationship, as shown in FIG. 1, such that one cantilever bends in one direction 165, and the other cantilever bends in the orthogonal direction 265. As set forth in U.S. patent application Ser. No. 11/263,912, incorporated by reference herein in its entirety, a compact electrical switch may be formed from two orthogonal actuators. One of the actuators, the "latch" actuator, is less stiff than the other actuator, the "spring" actuator. Using the actuators having different stiffnesses, the opening and closing algorithms for the switch may be simpler, and the switch may be made more compact than switches using two equivalent actuators. Because singly attached thermal actuator 2000 includes the flexible serpentines, it may be made less stiff than singly attached thermal actuator 1000. Accordingly, a compact electrical switch may be made using singly attached thermal actuator 1000 as the spring actuator, and singly attached thermal actuator 2000 as the latch actuator, as taught in the incorporated '912 application.

The singly attached thermal actuator may be manufactured using processes well known in the art of MEMS manufacturing. One exemplary method for forming the singly attached thermal actuator will be described next.

Figure 6:
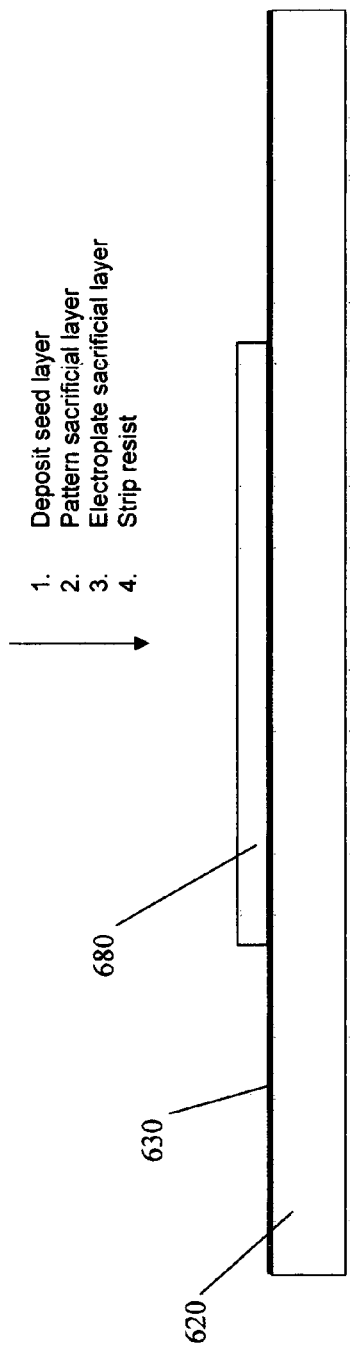
FIG. 6 illustrates a first step in the fabrication of the singly attached MEMS actuator.

FIG. 6 illustrates a first exemplary step in the fabrication of the singly attached thermal actuator 1000 or 2000. For simplicity, all the cantilever beams are referred to in FIGS. 6-10 simply as reference number 400. However, it should be understood that any and all cantilever beams 1110, 1120, 2110, and 2120 may be formed in a similar, if not identical fashion to cantilever 400 in the ensuing description.

The process begins with the deposition of a seed layer 630 for later plating of the cantilever 400, over the substrate 620. The seed layer 630 may be chromium (Cr) and gold (Au), deposited by chemical vapor deposition (CVD) or sputter deposition to a thickness of 100-200 nm. Photoresist may then be deposited over the seed layer 630, and patterned by exposure through a mask. A sacrificial layer 680, such as copper, may then be electroplated over the seed layer. The plating solution may be any standard commercially available or in house formulated copper plating bath. Plating conditions are particular to the manufacturer's guidelines. However, any other sacrificial material that can be electroplated may also be used. In addition, deposition processes other than plating may be used to form sacrificial layer 680. The photoresist may then be stripped from the substrate 620.

Figure 7:
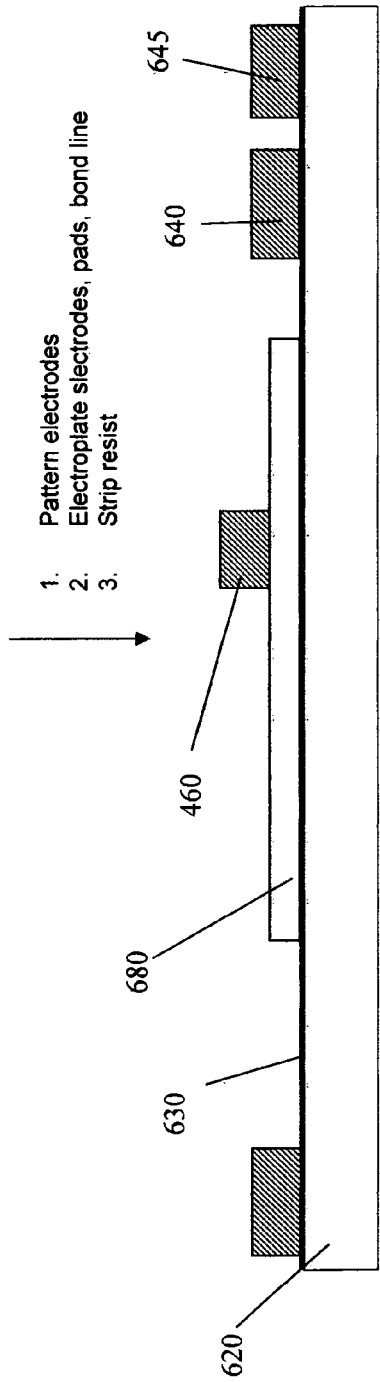
FIG. 7 illustrates a second step in the fabrication of the singly attached MEMS actuator.

A second exemplary step in fabricating the singly attached thermal actuator 1000 or 2000 is illustrated in FIG. 7. In FIG. 7, the substrate 620 is again covered with photoresist (not shown), which is exposed through a mask with features corresponding to gold pads 640 and 645 and a gold tip member 460. Gold may be used for the tip members 160, 260, 170 and 270 because it may have lower contact resistance than the material that will form the cantilever 400. The features 460 and 640 will subsequently be plated in the appropriate areas. The gold features 640, 645 may include a bonding ring, which may eventually form a portion of a hermetic seal which may bond a cap layer over the substrate 620 and actuator 1000 or 2000. One of the gold features 645 may also be an external access pad that will provide access to the singly attached thermal actuator 1000 or 2000 electrically, from outside the hermetically sealed structure.

The gold features 640, 645 and 460 may then be electroplated in the areas exposed by the photoresist, to form gold features 640, 645 and 460 and any other gold structures needed. The photoresist is then stripped from the substrate 620. The thickness of the gold features 640, 645 and 460 may be, for example, 1 µm.

Figure 8:
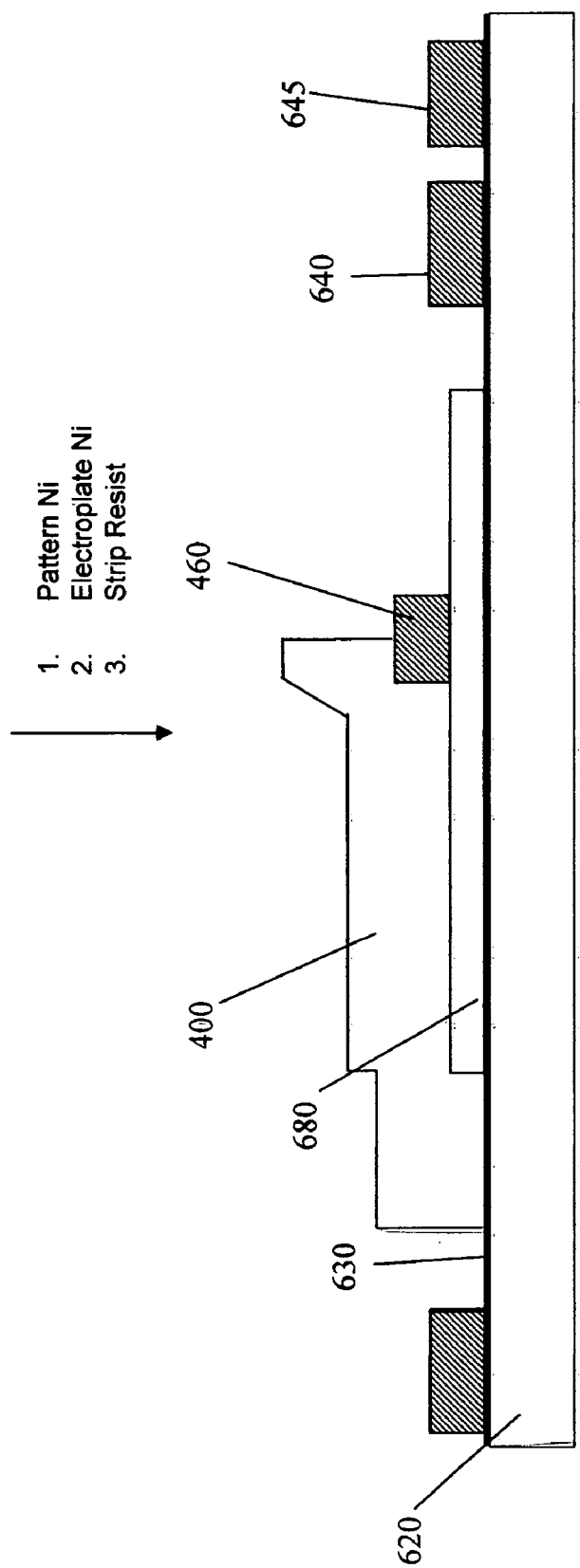
FIG. 8 illustrates a third step in the fabrication of the singly attached MEMS actuator.

FIG. 8 illustrates a third step in fabricating the singly attached thermal actuator 1000 or 2000. In FIG. 8, photoresist is once again deposited over the substrate 620, and patterned according to the features in a mask. The exposed portions of the photoresist are then dissolved as before to form a stencil for electroplating of the cantilever material, by exposing only certain appropriate areas of the seed layer 630 to the electroplating solution. The exposed seed layer 630 may then be electroplated with nickel or a nickel alloy to form the cantilevered beam 400. It should be understood that cantilever beam 400 may represent any and all of cantilevered beams 1120, 1222, 1224, 2110, 2122 or 2124 of the singly attached thermal actuator 1000 or 2000. The tip member 460 will be affixed to the cantilevered beam 400 by the natural adhesion of the gold to the nickel, after deposition of the nickel. Although nickel is chosen in this example, it should be understood that any other conductive material that can be electroplated may also be used. In addition, deposition processes other than plating may be used to form conductive cantilevered beam 400. Exemplary dimensions of the cantilevered beam 400 may be, for example, about 300 µm long, 5 µm wide and about 5 µm thick. However, it should be understood that these dimensions are exemplary only, and that other dimensions may be chosen, depending on the requirements of the application. The photoresist may then be stripped from the substrate 620.

Figure 9:
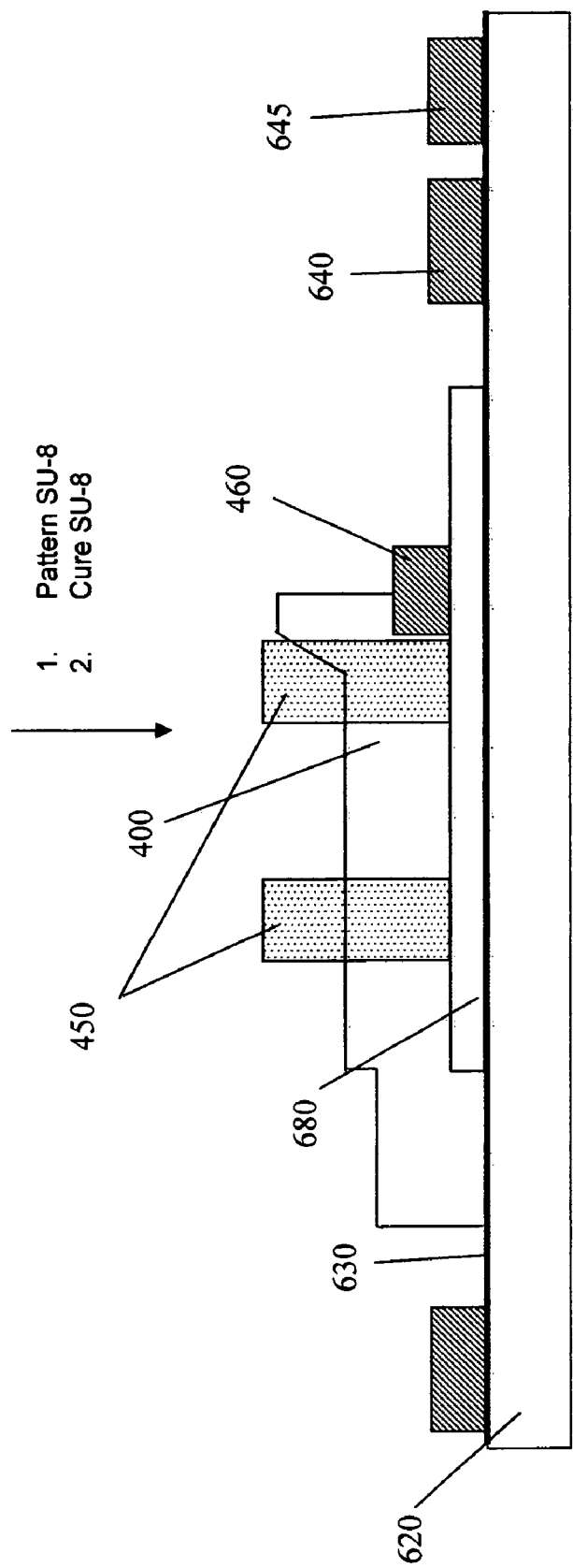
FIG. 9 illustrates a fourth step in the fabrication of the singly attached MEMS actuator.

FIG. 9 illustrates a fourth step in the fabrication of the compact MEMS switch 1000 or 2000. In FIG. 9, a polymeric nonconducting material such as the photoresist SU-8 is deposited over the substrate 620, the cantilevered beam 400 and the hot, inner arm. The photoresist is then cross linked, by for example, exposure to UV light. The unexposed resist is then dissolved and removed from the substrate 620 and structure 400 in all areas that the dielectric tether is absent. This step forms the dielectric tethers 450, that tether a single drive loop, such as 1122 and 2122 to cantilevered beam 1110 and 2110, respectively. In particular, this step forms dielectric tethers 1152, 1154, 2152 and 2154 on singly attached thermal actuators 1000 and 2000, respectively. This step, or a similar step, may also form tethers 1156, 2156 and 2158, that tether the outer arms 1124 and 2124 of the conductive circuits 1120 and 2120, respectively, to inner arms 1122 and 2122. The photoresist may then be cured by, for example, baking. The baking may be conducted for a period which assures that the photoresist is substantially cured, for example, at a temperature of at least about 210 degrees centigrade for at least about 30 minutes. The curing may also be accomplished using a continuously varying temperature profile, as set forth in U.S. patent application Ser. No. 11/364,334, incorporated by reference herein in its entirety.

It should be understood that if singly attached thermal actuator 1000 or 2000 is to be used as part of a switch, such as that shown in FIG. 1, then additional singly attached thermal actuators 1000 or 2000 may be fabricated in a manner similar and perhaps simultaneously with that described above for cantilever 400.

Figure 10:
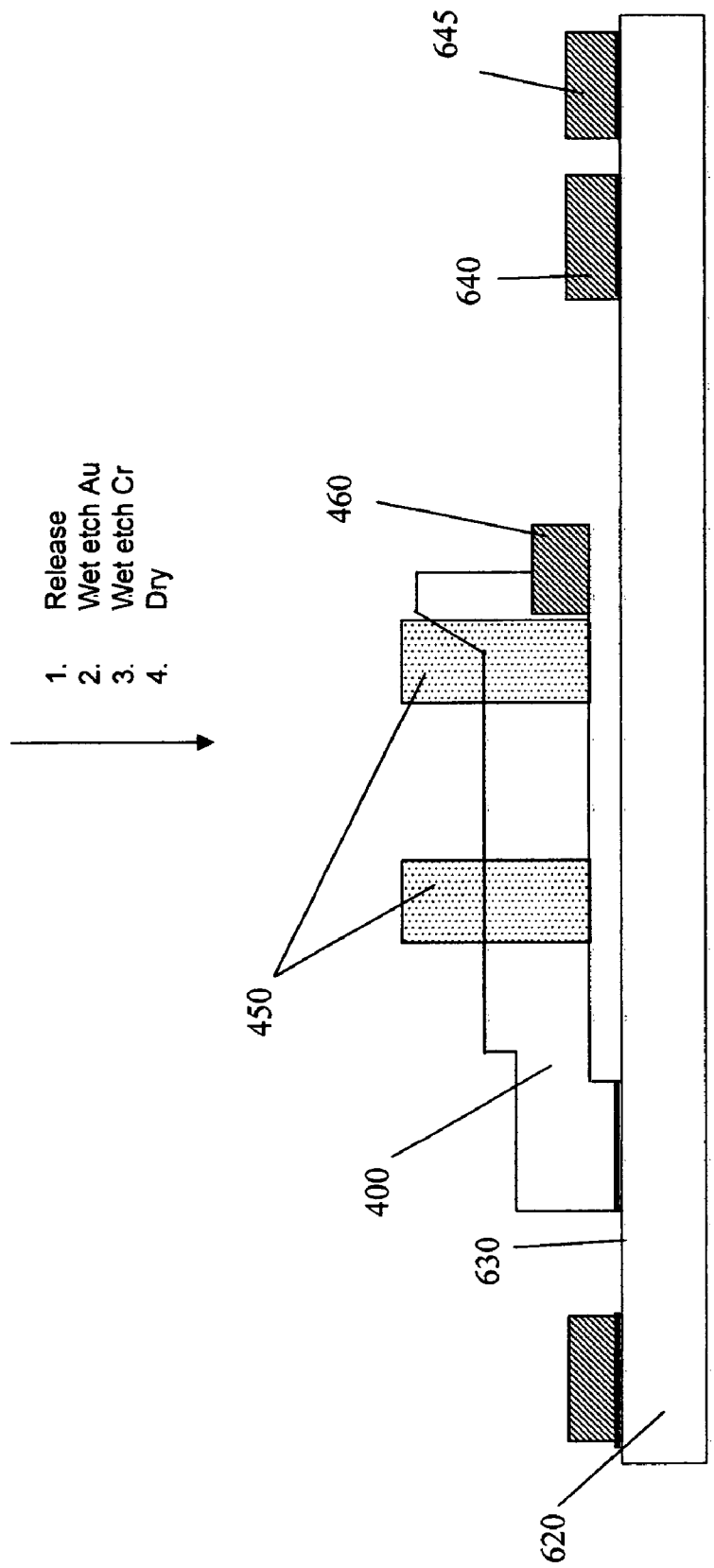
FIG. 10 illustrates a fifth step in the fabrication of the singly attached MEMS actuator.

FIG. 10 illustrates a fifth step in the fabrication of the singly attached thermal actuator 1000 or 2000. In this step, the cantilever 400 may be released by etching the sacrificial copper layer 680. Suitable etchants may include, for example, an isotropic etch using an ammonia based Cu etchant. The Cr and Au seed layer 630 is then also etched using, for example, a wet etchant such as iodine/iodide for the Au and permanganate for the Cr, to expose the $SiO_2$ surface of the substrate 620. The substrate 620 and MEMS actuator 1000 or 2000 may then be rinsed and dried.

The resulting singly attached MEMS thermal actuator may then be encapsulated in a protective lid or cap wafer. Details relating to the fabrication and assembly of a cap wafer may be found in co-pending U.S. patent application Ser. No. 11/211,625, and U.S. patent application Ser. No. 11/211,622 incorporated by reference herein in their entireties.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a microelectromechanical switch, it should be understood that the techniques and designs described above may be applied to any of a number of other microelectromechanical actuators, such as valves and sensors. Furthermore, details related to the specific design features and manufacturing steps of the singly attached MEMS actuator are intended to be illustrative only, and the invention is not limited to such embodiments. Accordingly, the exemplary implementations set forth above, are intended to be illustrative, not limiting.

What is claimed is:

1. A micromechanical device, comprising:
    a first cantilevered beam;
    a second cantilevered beam adjacent to the first cantilevered beam, and electrically coupled to a current return path, wherein only the second cantilevered beam is attached to the first cantilevered beam by a first dielectric tether, and wherein the second cantilevered beam is configured to expand, thereby driving the first cantilevered beam in a predetermined direction; and
    at least one other dielectric tether which couples only the second cantilevered beam to a flexible member that provides the current return path, wherein the current return path is not tethered directly to the first cantilevered beam.

2. The micromechanical device of claim 1, wherein the flexible member comprises a third cantilevered beam, wherein the second cantilevered beam and the third cantilevered beam comprise portions of an electrical circuit through which current is driven to heat the second cantilevered beam, thereby driving the first cantilevered beam in the predetermined direction.

3. The micromechanical device of claim 2, further comprising:
    an extension on a distal end of the second cantilevered beam, wherein the third cantilevered beam is coupled to the second cantilevered beam at a point inboard of the extension and wherein essentially no current flows through the extension.

4. The micromechanical device of claim 3, wherein a second dielectric tether couples the first cantilevered beam to the second cantilevered beam at a point over the extension, and wherein the second cantilevered beam is attached by the first dielectric tether to the first cantilevered beam at a point closer to a midpoint than the ends of the second cantilevered beam.

5. The micromechanical device of claim 4, wherein the third cantilevered beam further comprises at least one serpentine, wherein the distance between the third and the second cantilevered beams increases over some portion of the serpentine, and the third cantilevered beam with the at least one serpentine is substantially more flexible than the second cantilevered beam.

6. The micromechanical device of claim 5, wherein the at least one other dielectric tether couples the second cantilevered beam to the third cantilevered beam at a point within the at least one serpentine.

7. The micromechanical device of claim 2, wherein the third cantilevered beam is substantially more flexible than the second cantilevered beam.

8. The micromechanical device of claim 1, wherein the first and second cantilevered beams and the current return path each comprise nickel or a nickel alloy.

9. The micromechanical device of claim 1, wherein the first dielectric tether comprises a photopatternable polymer.

10. The micromechanical device of claim 1, further comprising a gold tip coupled to a distal end of the first cantilevered beam.

11. A micromechanical switch, comprising:
    a first micromechanical device of claim 1; and
    a second micromechanical device of claim 1, disposed in a substantially orthogonal orientation to the first micromechanical device of claim 1.

12. A method for manufacturing a micromechanical device, comprising:
    forming a first cantilevered beam;
    forming a second cantilevered beam adjacent to the first cantilevered beam;
    forming a current return path electrically coupled to the second cantilevered beam;
    configuring the second cantilevered beam to expand relative to the first cantilevered beam; and
    coupling only the second cantilevered beam to the first cantilevered beam with a first dielectric tether, such that the first cantilevered beam is driven in a predetermined direction by the expansion of the second cantilevered beam, and
    coupling only the second cantilevered beam to a flexible member with at least one other dielectric tether, wherein the flexible member provides the current return path, and is not coupled directly to the first cantilevered beam.

13. The method of claim 12, wherein forming the first cantilevered beam, forming the second cantilevered beam, and forming the current return path comprise electroplating at least one of nickel and a nickel alloy.

14. The method of claim 12, further comprising:
    applying a current to the second cantilevered beam and the current return path;
    heating the second cantilevered beam; and
    driving the first cantilevered beam in the predetermined direction by expansion of the second cantilevered beam.

15. The method of claim 12, wherein coupling the current return path to the second cantilevered beam comprises:
    forming an extension to a distal end of the second cantilevered beam; and
    electrically coupling a third cantilevered beam as the flexible member to the second cantilevered beam at a point inboard of the extension.

16. The method of claim 15, further comprising:
    coupling the first cantilevered beam to the second cantilevered beam with a second dielectric tether attached at a point on the extension and another point on the first cantilevered beam and wherein only the second cantilevered beam is attached to the first cantilevered beam by the first dielectric tether.

17. The method of claim 12, further comprising:
    coupling only a third cantilevered beam as the flexible member to the second cantilevered beam with the at least one other dielectric tether, wherein the third cantilevered beam is substantially more flexible than the second cantilevered beam.

18. The method of claim 12, further comprising:
    forming at least one serpentine in a third cantilevered beam as the flexible member; and
    coupling the third cantilevered beam to the second cantilevered beam with the at least one other dielectric tether attached to the third cantilevered beam at a point within the serpentine.

19. The method of claim 12, further comprising:
    coupling a gold tip to a distal end of the first cantilevered beam.

20. The method of claim 12, wherein connecting only the second cantilevered beam to the first cantilevered beam with a first dielectric tether comprises:
    applying a photopatternable polymer layer over the substrate;
    patterning the layer of photopatternable polymer over and between the first cantilevered beam and the second cantilevered beam; and
    baking the photopatternable polymer until it is substantially cured.

* * * * *